(12) United States Patent
Meyer et al.

(10) Patent No.: US 10,940,671 B2
(45) Date of Patent: Mar. 9, 2021

(54) SUBSTRATE FOR ELECTRICAL CIRCUITS AND METHOD FOR PRODUCING A SUBSTRATE OF THIS TYPE

(71) Applicant: Rogers Germany GmbH, Eschenbach (DE)

(72) Inventors: Andreas Meyer, Wenzenbach (DE); Karsten Schmidt, Eschenbach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 21 days.

(21) Appl. No.: 15/744,349

(22) PCT Filed: Jul. 18, 2016

(86) PCT No.: PCT/EP2016/067074
§ 371 (c)(1),
(2) Date: Jan. 12, 2018

(87) PCT Pub. No.: WO2017/013075
PCT Pub. Date: Jan. 26, 2017

(65) Prior Publication Data
US 2018/0200989 A1    Jul. 19, 2018

(30) Foreign Application Priority Data
Jul. 17, 2015   (DE) ..................... 10 2015 111 667.7

(51) Int. Cl.
*B32B 9/00* (2006.01)
*B32B 15/04* (2006.01)
(Continued)

(52) U.S. Cl.
CPC ............... *B32B 9/005* (2013.01); *B32B 5/12* (2013.01); *B32B 5/20* (2013.01); *B32B 7/12* (2013.01);
(Continued)

(58) Field of Classification Search
CPC ................................ B32B 9/005; B32B 9/041
See application file for complete search history.

(56) References Cited

U.S. PATENT DOCUMENTS

| 4,537,799 A | * | 8/1985 | Dorey, II | ............... H05K 3/184 205/126 |
| 6,839,219 B2 | | 1/2005 | Mashiko et al. | |

(Continued)

FOREIGN PATENT DOCUMENTS

| EP | 0217311 A2 | 4/1987 |
| EP | 0525644 A1 | 2/1993 |

(Continued)

OTHER PUBLICATIONS

International Search Report for International Application No. PCT/EP2016/067074, dated Jul. 18, 2016, 13 pages (German).

*Primary Examiner* — Alexandre F Ferre
(74) *Attorney, Agent, or Firm* — Cantor Colburn LLP

(57) ABSTRACT

A substrate (1, 10) for electrical circuits, comprising at least one metal layer (2,3, 14) and a paper ceramic layer (11), which is joined face to face with the at least one metal layer (2,3, 14) and has a top side and bottom side (11a, 11b), wherein the paper ceramic layer (11) has a large number of cavities in the form of pores. Especially advantageously, the at least one metal layer (2, 3, 14) is connected to the paper ceramic layer (11) by means of at least one glue layer (6, 6a, 6b), which is produced by applying at least one glue (6a', 6a", 6b', 6b") to the metal layer (2,3, 14) and/or to the paper ceramic layer (11), wherein the cavities in the form of pores in the paper ceramic layer (11) are filled at least at the surface by means of the applied glue (6a', 6a", 6b',6b").

23 Claims, 5 Drawing Sheets

(51) Int. Cl.
  *B32B 15/12* (2006.01)
  *B32B 15/20* (2006.01)
  *B32B 29/00* (2006.01)
  *B32B 29/08* (2006.01)
  *B32B 5/12* (2006.01)
  *B32B 5/20* (2006.01)
  *B32B 7/12* (2006.01)
  *B32B 9/04* (2006.01)
  *B32B 9/06* (2006.01)
  *C25D 11/00* (2006.01)
  *C25D 11/04* (2006.01)
  *C25D 17/12* (2006.01)
  *H01L 23/373* (2006.01)
  *H05K 1/05* (2006.01)
  *H05K 1/02* (2006.01)
  *H05K 1/03* (2006.01)
  *H05K 3/46* (2006.01)
  *C25D 11/08* (2006.01)

(52) U.S. Cl.
  CPC ............ *B32B 9/041* (2013.01); *B32B 9/06* (2013.01); *B32B 15/043* (2013.01); *B32B 15/12* (2013.01); *B32B 15/20* (2013.01); *B32B 29/002* (2013.01); *B32B 29/08* (2013.01); *C25D 11/005* (2013.01); *C25D 11/04* (2013.01); *C25D 17/12* (2013.01); *H01L 23/3735* (2013.01); *H05K 1/0201* (2013.01); *H05K 1/0313* (2013.01); *H05K 1/053* (2013.01); *H05K 3/4688* (2013.01); *B32B 2255/06* (2013.01); *B32B 2255/205* (2013.01); *B32B 2255/26* (2013.01); *B32B 2255/28* (2013.01); *B32B 2264/107* (2013.01); *B32B 2307/202* (2013.01); *B32B 2307/206* (2013.01); *B32B 2307/54* (2013.01); *B32B 2457/08* (2013.01); *B32B 2605/00* (2013.01); *C25D 11/08* (2013.01); *H05K 2201/0116* (2013.01); *H05K 2201/0338* (2013.01); *H05K 2203/0315* (2013.01); *H05K 2203/11* (2013.01); *H05K 2203/1126* (2013.01)

(56) References Cited

U.S. PATENT DOCUMENTS

| | | | |
|---|---|---|---|
| 7,738,249 B2 | 6/2010 | Chan et al. | |
| 9,723,707 B2 | 8/2017 | Terasaki et al. | |
| 9,730,310 B2 | 8/2017 | Meyer et al. | |
| 2005/0023032 A1* | 2/2005 | Kawai | B32B 7/04 |
| | | | 174/258 |
| 2007/0139864 A1* | 6/2007 | Dunn | H01G 9/0032 |
| | | | 361/523 |
| 2009/0011208 A1* | 1/2009 | Hofenauer | B01D 67/0067 |
| | | | 428/219 |
| 2011/0186123 A1 | 8/2011 | Mukai | |
| 2012/0103588 A1 | 5/2012 | Kim et al. | |
| 2014/0345914 A1 | 11/2014 | Meyer et al. | |

FOREIGN PATENT DOCUMENTS

| | | |
|---|---|---|
| EP | 0786505 A2 | 7/1997 |
| EP | 2068361 A | 10/2009 |
| GB | 2125618 A | 3/1984 |
| JP | 51040563 | 4/1976 |
| JP | S62268631 A | 11/1987 |
| JP | H01242470 | 9/1989 |
| JP | H036086 A | 1/1991 |
| JP | H03239390 A | 10/1991 |
| JP | H08213511 A | 3/1994 |
| JP | H1017838 A | 1/1998 |
| JP | 2005064168 | 3/2005 |
| JP | 4635300 | 2/2011 |
| KR | 100934476 B1 | 12/2009 |
| WO | 2015061649 A1 | 4/2015 |

\* cited by examiner

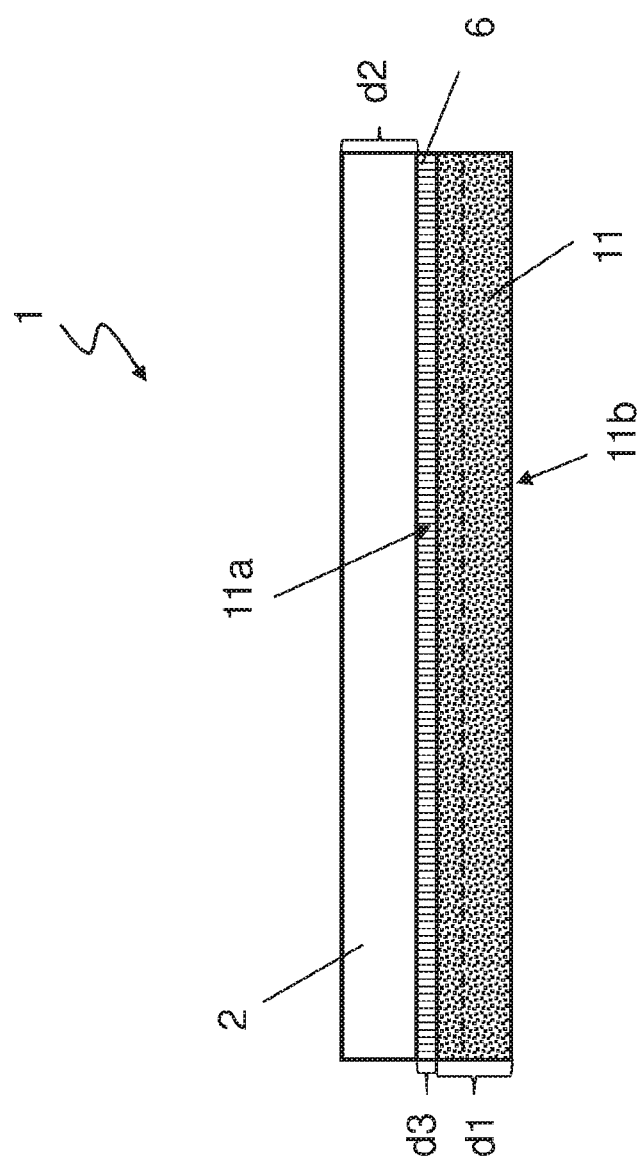

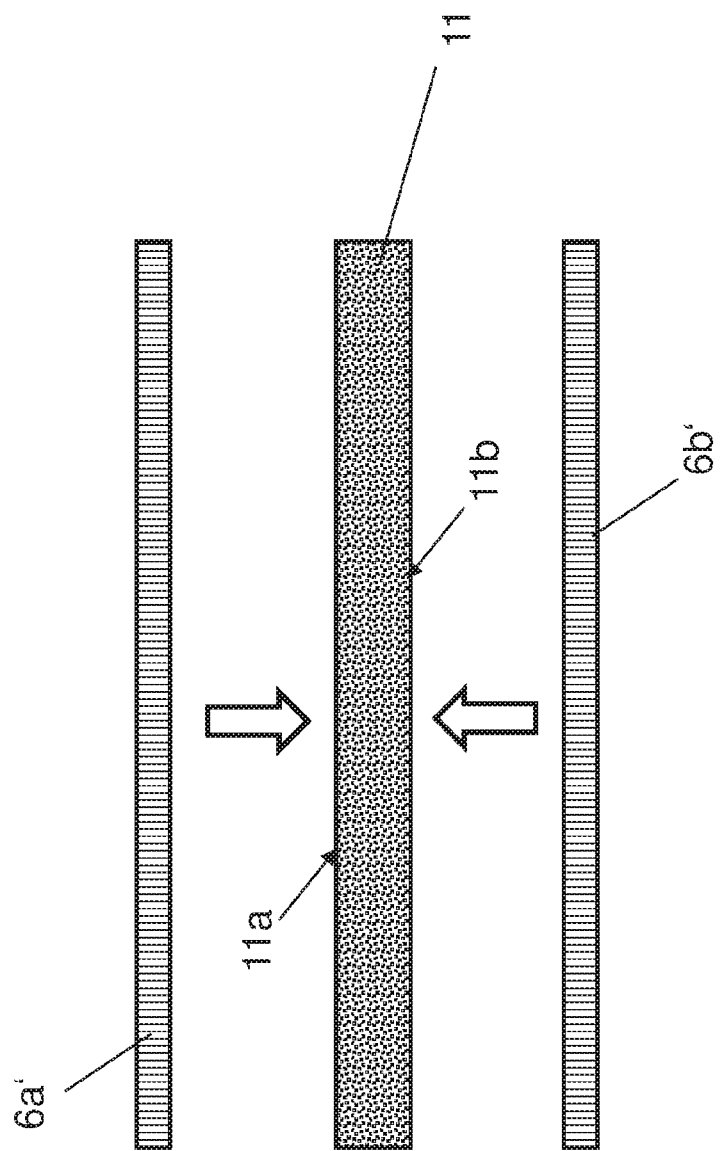

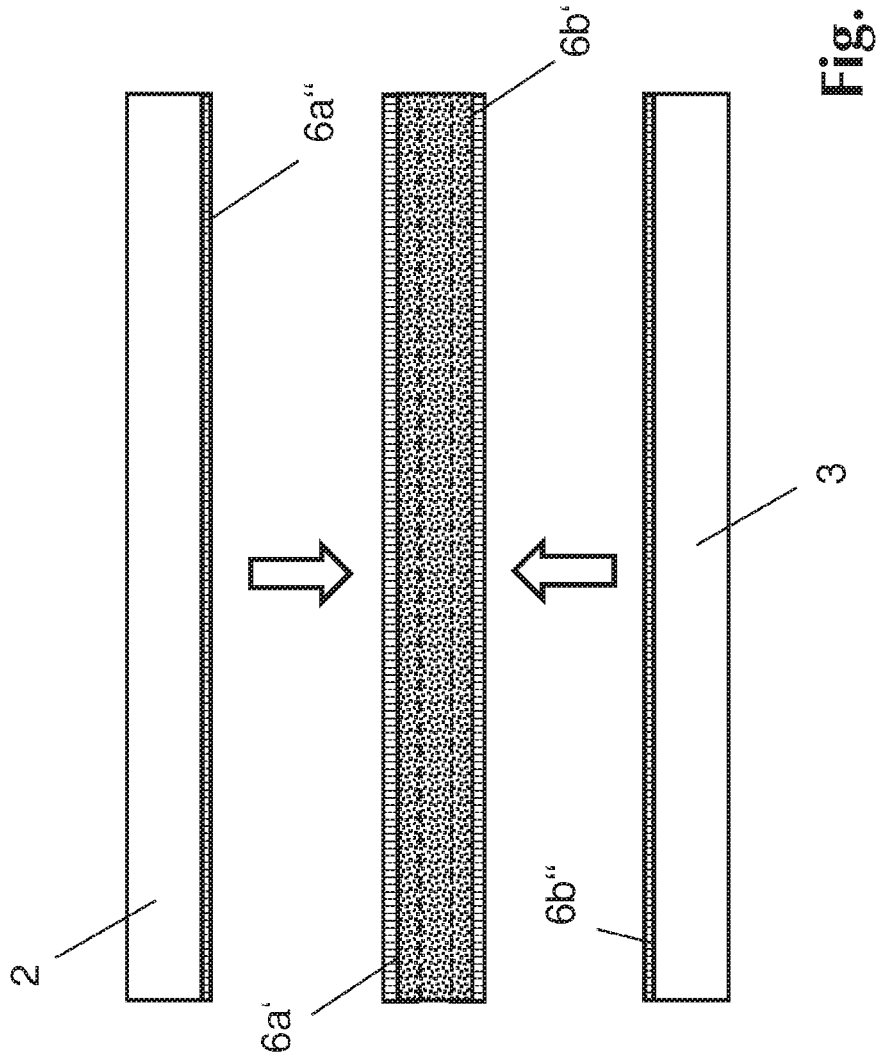

SUBSTRATE FOR ELECTRICAL CIRCUITS AND METHOD FOR PRODUCING A SUBSTRATE OF THIS TYPE

CROSS-REFERENCE TO RELATED APPLICATIONS

This application is a National Stage filing of PCT/EP2016/067074, filed 18 Jul. 2016, which claims priority to DE 10 2015 111 667.7, filed 17 Jul. 2015.

BACKGROUND

The invention applies to a substrate for electrical circuits according to the preamble of claim 1 as well as a method for producing such a substrate according to the preamble of claim 18.

Substrates for electrical circuits in the form of circuit boards are well known in the art.

To this effect, such substrates are multilayer substrates and comprise at least one isolation layer and flatly at least one metal layer or metallization connected to such isolation layer. The metal layer or the metallization is joined to the isolation layer, either directly or, possibly, via additional metal or isolation layers and is structured into several metallization surface portions in order to form circuit boards, contacts, contact and/or contact surfaces.

In particular in the field of the use of such substrates in power electronics, i.e. so-called low voltage applications, such as for the construction of power semiconductor modules in a voltage range of less than 2.5 kV, it is necessary that the substrates and/or their isolation layer have a high isolation strength, i.e. voltage and disruptive strength.

Therefore, metal ceramic substrates are often used in the field of power electronics, the isolation layer of which is formed of at least one ceramic layer having a high isolation strength. For example, the ceramic layer is made of oxide, nitride or carbide ceramic, such as aluminium oxide (Al2O3) or aluminium nitride (AlN) or silicium nitride (Si3N4) or silicium carbide (SiC) or of aluminium oxide with zirconium oxide (Al2O3+ZrO2).

In order to flatly join the ceramic layer to at least one metal layer forming a metallization, distinct manufacture methods known in the art are used, depending on the ceramic material used and/or the metal of the metal layer to be bonded, i.e. for example a "direct-copper-bonding" method, a "direct-aluminium-bonding" method and an "active-metal-bonding" method. The disadvantages of such manufacture methods are the complex and costly technical processes. Shaping is also restricted when using conventional ceramic layers.

Moreover, methods for producing highly charged papers, such as from DE 10 2006 022 598 A1, US 2009011208 A1 or U.S. Pat. No. 8,608,906 B2 are known in the art and where the paper structure is enriched by up to 85% by weight with functional filler material, e. g with sinterable ceramic powered, highly adsorptive powder or powder offering good heat storage capacities, during the paper production process. Said ceramic filler material comprises the electrical isolation properties known in the art. Examples of suitable ceramic filler material and/or main filler material for the paper structure include for example $Al_2O_3$, $Si_3N_4$, AlN, $ZrO_2$, MgO, SiC and BeO, but also combinations of these, such as ZTA in particle grain sizes of <5 μm, preferably of <1 μm. The sintering additives of the respective main filler materials, namely $Y_2O_3$, CAO, MgO, $SiO_2$, etc. are used as additional ceramic filler material and/or ancillary filler material to be included into the paper structure. A so-called sinter paper and/or a paper ceramic is produced from said pre-ceramic paper structure enriched with sinterable ceramic filler materials, possibly, after an additional shaping process by thermal implementation, among others, performing a two-step thermal implementation. In the context of the first step of the thermal implementation, organic components of the pre-ceramic papers, such as pulp, starch and latex, are removed by oxidation, thereby generating a so-called "brown compact". Subsequently, the "brown compact" is sintered in a second step of the thermal implementation, thereby generating a ceramic substance having the typical bending strength of ceramic. Among others, the microstructure of said sinter paper and/or the paper ceramic shows the material properties typical for ceramics, for example also a high isolation strength. Such paper ceramics enable combining the advantages of ceramic materials with the paper-related technical advantages, such as simple shaping and low weight. Removal by oxidation of the organic components, in particular of cellulose fibres as bonding agent of the paper structure in the paper ceramic generates however, as a disadvantage, cavities in the form of pores that lead to porosity of the paper ceramic material of less than 50%. Said porosity of the paper ceramic material entails a degradation of the isolation strength, in particular when the paper ceramic material is used in substrates for electrical circuits.

SUMMARY

Based upon the aforementioned state of the art, the object of the invention is to illustrate a substrate for electrical circuits as well as an associated method for producing such a substrate which, compared to the substrates known in the art, can be produced in a simple and cost-efficient way and the isolation layer of which produced from a paper ceramic comprises an improved isolation strength. The object is achieved by a substrate according to claim 1 and a method according to claim 18.

The essential aspect of the substrate according to the invention for electrical circuits is the fact that the at least one metal layer is connected via at least one adhesive layer to the paper ceramic layer which is produced by application of at least one adhesive to the metal layer and/or to the paper ceramic layer, wherein the cavities in the form of pores in the paper ceramic layer are filled at least on the surface side. Apart from the production of the adhered connection between the at least one metal layer and the paper ceramic layer, the residual porosity of the paper ceramic layer is as a particular advantage significantly reduced by at least filling the surface side of their cavities in the form of pores, thereby clearly improving the isolation properties of the substrate. As a particular advantage and following filling with adhesive, the paper ceramic layer has a porosity of less than 10%, preferably less than 5%.

Herein, a paper ceramic layer according to the invention is meant to be a paper structure enriched during the paper production with a sinterable ceramic filler material, preferably aluminium oxide powder of which a pre-ceramic paper structure is generated. The pre-ceramic paper structure undergoes a two-step thermal implementation process and in the first step, one generates initially a "brown compact" from the pre-ceramic paper structure ("green compact"), wherein the organic components of the pre-ceramic paper structure, such as pulp, starch and latex, are removed by oxidation. Subsequently in a second step, the "brown compact" is delivered to a sinter process, wherein a ceramic substance, namely the paper ceramic, is generated. Advantageously, the paper ceramic layer has the typical material properties of a ceramic material, i.e. a high bending and isolation strength. In this way, the paper ceramic layer replaces the ceramic layer known in the art of metal ceramic substrates. The designated manufacture method enables significant advantages during the manufacture process as well as in the shaping of the paper ceramic layer. Compared to a conventional ceramic layer, the paper ceramic layer is lighter and shapeable on an individual basis prior to realising the thermal implementation process. Owing to its deformability, the raw material of the paper ceramic layer can also advantageously be stored and processed as roll goods.

As a particular advantage, the paper ceramic layer is produced with a paper structure enriched with ceramic, sinterable filler material by means of thermal implementation, wherein the percentage of ceramic, sinterable filler material of the enriched paper structure exceeds 80 wt. %, preferably ranges between 80 and 90% by weight. $Al_2O_3$, $Si_3N_4$, AlN, $ZrO_2$, MgO, SiC, BeO or a combination of these as well as associated typical sinter means, such as $Y_2O_3$, CaO, MgO, $SiO_2$, are provided as ceramic filler material of the paper structure.

In a preferred embodiment, the metal layer or the composite layer is connected to the paper ceramic layer via at least one adhesive layer or solder layer, and this independently from the respective form of the metal layer and/or the composite layer.

In an alternative embodiment, the at least one metal layer is connected to at least one additional metal layer to form a composite layer. According to the invention, the composite layer is in turn connected to the paper ceramic layer via an adhesive layer. It is obvious that the substrate can also comprise several composite layers, for example a first and a second composite layer, which are each flatly joined with the top and/or the bottom side of the paper ceramic layer via an adhesive layer.

Advantageously, the paper ceramic layer comprises a layer thickness between 50 µm and 600 µm, preferably between 80 µm and 150 µm and an e-module between 90 GPa and 150 GPa.

In a preferred embodiment, the paper ceramic layer comprises a top and a bottom side, wherein the top side is flatly joined with a first metal layer via an adhesive layer and the bottom side with a second metal layer via another adhesive layer. Such a substrate comprising three layers has good isolation properties for a use in the "low voltage" range and a high mechanical stability while having a low substrate thickness.

As a particular advantage, an adhesive having a viscosity of less than 30 Pas is used for producing the adhesive layer, i.e. for producing an adhesive layer having a layer thickness ranging between 1 and 30 µm, preferably between 1 and 10 µm. Hereby, the layer thickness indicates the distance between the top and/or the bottom side of the paper ceramic layer and the top surface of the layer adjoining thereto, in particular a metal or composite layer.

The adhesive layer is made of a chemically and/or physically thermosettable adhesive of the group comprising polyurethane, epoxy resins, polyimides, or methyl methacrylate, wherein the penetration depth of the adhesive into the paper ceramic layer and/or their cavities in the form of pores preferably represent at least one third of the layer thickness of the paper ceramic layer adjoining to the adhesive layer. Thereby, at least one third of the cavities in the form of pores is advantageously filled with adhesive on the surface, i.e. preferably both on the top and on the bottom side of the paper ceramic layer, i.e. in aggregate at least two thirds of the cavities in the form of pores. In an alternative embodiment, the cavities in the form of pores in the paper ceramic layer are almost completely filled with adhesive in order to obtain optimum isolation properties. For example, the adhesive layer can also be produced from at least two distinct adhesives, possibly having each a distinct viscosity.

Another advantage is represented by the at least one metal layer made of copper, aluminium, gold, silver, tin, zinc, molybdenum, tungsten, Cr, or other alloys of these. For example, the composite layer can comprise a metal layer and at least one aluminium layer or one aluminium alloy layer, wherein in this alternative embodiment, the metal layer is preferably realised in the form of a copper layer or a copper alloy layer. The layer thickness of the copper layer or the copper alloy layer then ranges for example between 35 µm and 2 mm and the layer thickness of the aluminium layer or the aluminium alloy layer between 10 µm and 300 µm. As another advantage, the aluminium layer of the composite layer can be anodized to generate an anodic layer on the surface opposite to the metal layer in order to obtain enhanced adherence. In an advantageous alternative embodiment, the aluminium layer of the composite layer comprises an aluminium silicium layer.

Another object of the invention is a method for producing a substrate for electric circuits, comprising at least one metal layer and at least one paper ceramic layer having a top and a bottom side, wherein at least the top or bottom side is flatly joined to the at least one metal layer, wherein the paper ceramic layer comprises a large number of cavities in the form of pores. An essential aspect of the method of the invention is the fact that adhesive is applied flatly onto the at least one metal layer and/or onto the top and/or bottom side of the paper ceramic layer in order to produce at least one adhesive layer, namely such that by means of the adhesive applied, the cavities in the form of pores are filled in the paper ceramic layer at least on the surface side. The adhesive flatly applied in an amount calculated accordingly penetrates at least into the surface of the cavities in the form of pores and closes these at least partially such that the porosity and/or the residual porosity of the paper ceramic layer is reduced at least in the surface side portion of the paper ceramic layer adjoining to the adhesive layer. Herein, distinct adhesive variants are possible on an exemplary basis.

In a first alternative embodiment, for example, the adhesive is flatly applied exclusively onto the surface side of the at least one metal layer and subsequently adhered with the top or bottom side of the paper ceramic layer. Thereby, the adhesive gets in contact with the paper ceramic layer only following structuring of the metal layer.

In a second alternative embodiment, the adhesive is flatly applied exclusively onto the top and/or bottom side of the paper ceramic layer and subsequently adhered with the at least one metal layer. Then, the cavities in the form of pores are at least partially filled advantageously during application of the adhesive already, i.e. prior to the actual joining process.

In a third embodiment, the adhesive is flatly applied both onto the surface side of the at least one metal layer and onto the top and/or bottom side of the paper ceramic layer and subsequently both are adhered together. This enables both optimum filling of the cavities in the form or pores and producing of an adhesive connection having a high connection strength, in particular when curing the adhesive application at least partially prior to the actual joining process. In another alternative embodiment, at least two distinct adhesive types are applied onto the at least one metal layer and onto the top and/or bottom side of the paper ceramic layer, wherein the viscosity of the adhesive applied to the paper ceramic layer preferably is lower than the viscosity of the adhesive applied onto the metal layer. A thinner fluid adhesive than the one used for producing the adhesive connection to the metal can advantageously used herein in order to fill the cavities in form of pores.

In a fourth embodiment, the adhesive is flatly applied exclusively via the top or bottom side of the paper ceramic layer, wherein the amount of adhesive is calculated such that the cavities in the form of pores are almost completely filled. Hence, filling of the cavities in the form of pores is realised via a side of the paper ceramic layer.

As a particular advantage, the amount of adhesive used is determined such that, when being in the connected state, an adhesive layer is generated having a layer thickness ranging from 1 to 30 µm, preferably from 1 to 10 µm.

Advantageously, the cavities in the form of pores of the paper ceramic layer are filled with adhesive such that following filling, the paper ceramic layer comprises a porosity of less than 10%, preferably of less than 5%.

As another advantage, the cavities in the form of pores are filled by means of the adhesive alongside at least one third of the layer thickness of the paper ceramic layer.

Further developments, advantages, and application options of the invention also result from the following description of the exemplary embodiments and from the figures. Therein, any and all characteristics described and/or illustrated are basically an object of the invention, alone or in any combination, irrespective of their summary made in the claims or any reference made thereto. Here, too, the content of the claims becomes part of the description.

BRIEF DESCRIPTION OF THE FIGURES

Hereinafter, the invention will be explained in more detail based on the figures and by means of exemplary embodiments, wherein FIG. 1 shows a simplified, schematic sectional representation of a substrate according to the invention, comprising a first metal layer and a paper ceramic layer joined thereto via an adhesive layer;

FIG. 2a-c shows a simplified representation of selected steps of the invention to produce a substrate according to the invention, comprising a first and a second metal layer and a paper ceramic layer received therebetween and joined by means of adhesive layers.

FIG. 1 shows a simplified, schematic representation of a substrate through a substrate 1 formed according to the invention for electrical circuits and which comprises a disc-form and multilayer structure, i.e. which is formed in the shape of a circuit board. The substrate 1 of the invention is especially suitable for so-called "low-voltage" applications, i.e. for the construction of electrical circuits in a voltage range of less than 2.5 kV.

Figure 2C:
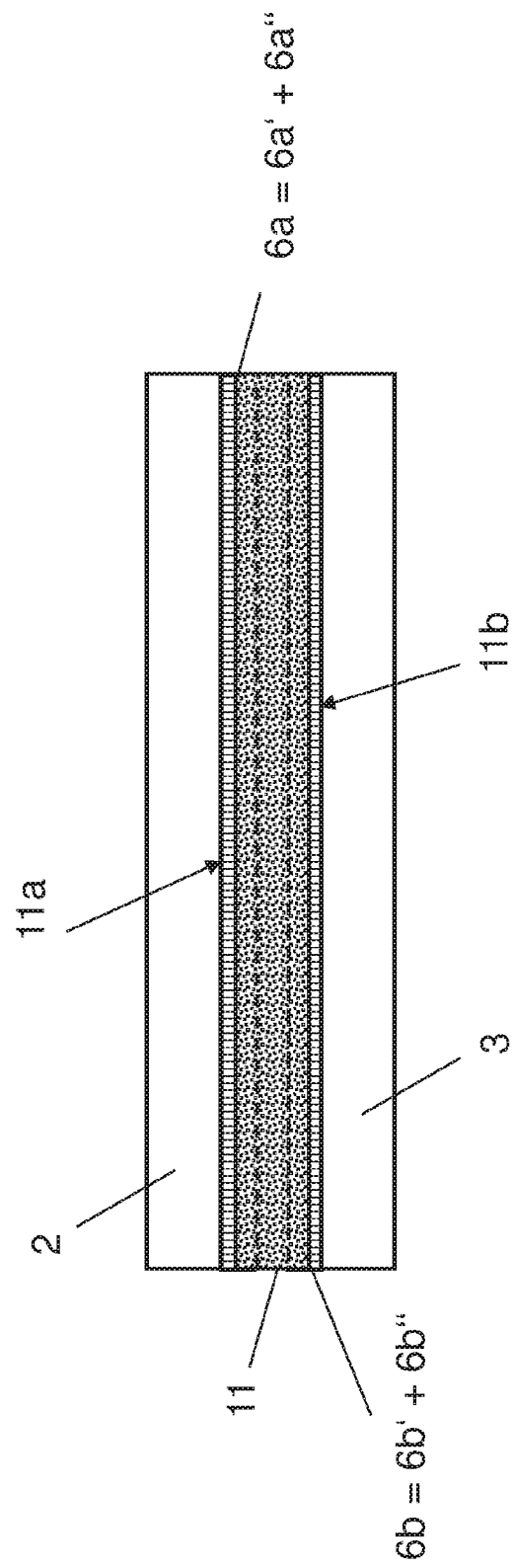
Figure 3:
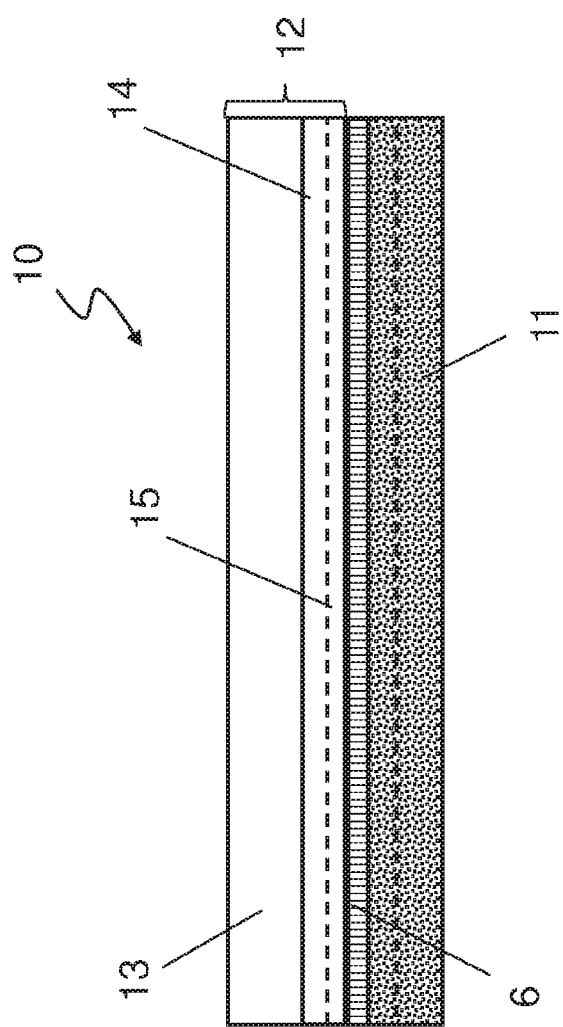
FIG. 3 shows a simplified, schematic sectional representation by way of a substrate according to the invention, comprising a composite layer and a paper ceramic layer joined thereto via an adhesive layer.

The substrate 1 according to the invention for electrical circuits thereby comprises at least a first metallization and/or metal layer 2 and a paper ceramic layer 2 flatly joined to the at least one first metallization and metal layer 2, wherein the paper ceramic layer 11, due to its production, comprises a plurality of cavities in the form of pores. After the production of very thin paper ceramic layers 11, defaults can occur in the form of cracks during further processing thereof, and in addition entailing degradation of their isolation properties.

In this exemplary embodiment according to FIG. 1, the paper ceramic layer 11 comprises a top and a bottom side 11a, 11b and the first metallization layer and/or metal layer 2 is flatly joined to the top side 11a of the paper ceramic layer 11. In an alternative, preferred embodiment, the substrate 1 comprises a second metal layer 3 in addition to the first metal layer 2 and which is flatly joined to the bottom side 11b of the paper ceramic layer 11. Thereby and as an example, the paper ceramic layer 11 has a first layer thickness d1 and the first and/or a potential second metal layer 2, 3, has a second layer thickness d2.

According to the invention, by a paper ceramic layer 11 and/or a ceramic produced by paper technology, a paper structure is meant, enriched with sinterable ceramic filler material, preferably in powder form, during the paper production, from which a pre-ceramic paper structure is generated in an intermediate step.

Preferably, the percentage of the sinterable ceramic filler material of the pre-ceramic paper structure exceeds 80% by weight, preferably it ranges between 80 and 90% by weight. The production of this type of "paper ceramics" and/or paper ceramic layers 11 is basically known in the art.

Examples of suitable ceramic filler material and/or main filler material for the paper structure include in particular $Al_2O_3$, $Si_3N_4$, AlN, $ZrO_2$, MgO, SiC and BeO, but also combinations of these, such as ZTA in grain sizes of <5 µm, preferably of <1 µm. The additives of the respective main filler materials, i.e., $Y_2O_3$, CaO, MgO, $SiO_2$, etc. are used as typical ceramic filler material and/or ancillary filler material to be included into the paper structure. The corresponding pre-ceramic paper structure then undergoes a two-step thermal implementation process and in the first step, one generates initially a "brown compact" from the pre-ceramic paper structure ("green compact"), wherein the organic components of the pre-ceramic paper structure, such as pulp, starch and latex, are removed by oxidation. Subsequently a second step, the "brown compact" is delivered to a sinter process wherein a ceramic substance, i.e. the paper ceramic, is generated with the typical material properties of a ceramic material, such as for example a high bending and isolation strength. However, compared to a conventional ceramic layer, the paper ceramic layer 11 is lighter and shapeable on an individual basis prior to realising the thermal implementation process. Due to its deformability, the raw material of the paper ceramic layer 11, i.e. the pre-ceramic paper structure, can also be stored and processed as roll goods. The paper ceramic layer 11 used according to the invention comprises for example a layer thickness d1 between 50 µm and 600 µm, preferably between 80 µm and 150 µm and has an e-module between 90 GPa and 150 GPa.

In the context of the manufacture method described of the paper ceramic layer 11, a plurality of cavities in form of pores is generated by removal by oxidation of the organic components in the paper structure. The cavities in the form of pores can be opened on the surface side or be completely received in the paper ceramic layer 11, i.e. extend within the paper ceramic layer 11. Thereby, the cavities in the form of pores often have the form of cellulose fibres removed by oxidation and are approximately homogeneously distributed over the aggregate paper ceramic layer 11. Due to the plurality of cavities in the form of pores, the paper ceramic layer 11 comprises for example a porosity and/or a residual porosity of less than 50%, preferably of less than 30%, by which the isolation strength of the paper ceramic layer 11, in particular when used in a substrate 1 for electrical circuits, is impaired. This is the starting point for the invention.

According to the invention, the at least one metal layer 2, 3 is joined to the paper ceramic layer 11 via an adhesive layer 6, 6a, 6b, namely the at least one adhesive layer 6, 6a, 6b is generated by applying at least one adhesive 6a', 6a", 6b', 6b" onto the at least one metal layer 2, 3 and/or onto the top and/or bottom side 11a, 11b of the paper ceramic layer 11 such that by means of the adhesive 6a', 6a", 6b', 6b" applied, the cavities in the form of pores in the paper ceramic layer 11 are at least partially filled at least on their surface, i.e. in the area of the top and/or the bottom side 11a, 11b of the paper ceramic layer 11. Thereby, at least the cavities in the form of pores in the paper ceramic layer 11 opened on the surface side are closed by means of the adhesive 6a', 6a", 6b', 6b". Preferably, the adhesive is introduced at least partially in the cavities in the form of pores adjoining to and/or arranged in the area of the top and/or bottom side 11a, 11b of the paper ceramic layer 11 and, as the case may be, also in potential cracks of the paper ceramic layer 11 in the context of the production of the adhesive connection between the at least one metal layer 2, 3 and the paper ceramic layer 11, i.e. the adhesive 6a', 6a", 6b', 6b" penetrates into the cavities in the form of pores and closes these completely in the portion of the paper ceramic layer 11 adjoining to the top and/or bottom side 11a, 11b of the paper ceramic layer 11. Advantageously, the porosity of the paper ceramic layer 11 is thereby reduced to less than 10%, thereby significantly improving its isolation strength. Preferably, more than the half of the cavities in the form of pores in the paper ceramic layer 11 are filled at least partially with the adhesive, i.e. subsequently to the adhesive layers 6, 6a, 6b generated by the adhesive application 6a', 6a", 6b', 6b". In FIG. 1, the penetration depth of the adhesive application 6a', 6b' into the cavities in the form of pores of the paper ceramic layer 11 is shown in a dotted line, i.e. the adhesive 6a', 6b' has penetrated at least to one third of the layer thickness d1 adjoining to the adhesive layer 6 into the paper ceramic layer 11. Thereby, the penetration depth of the adhesive 6a', 6b' comes to at least one third of the layer thickness d1 of the paper ceramic layer 11.

Based upon a paper ceramic layer 11 comprising a plurality of cavities in the form of pores, i.e. porous one, and the at least one metal layer 2, 3, these are equipped with an adhesive application 6a, 6b such that an adhesive layer 6, 6a, 6b in a joined state and having a layer thickness d3 ranging from 1 and 30 μm, preferably from 1 to 10 μm is generated.

The amount of adhesive necessary to this end is calculated such that it exceeds the volume defined by the desired layer thickness d3 and the dimensions of the metal layer 2, 3 and/or the paper ceramic layer of the adhesive layer 6, 6a, 6b such that the additional amount of adhesive does not only enable at least partial filling of the cavities in the form of pores, but, possibly, also the realization of compensation of the surface roughness of the respective metal layer 2, 3 and/or the top and/or bottom side 11a, 11b of the paper ceramic layer 11.

Adhesive can be applied using the methods known in the art, whereby one can in particular also realise pre-hardening of the adhesive applied, especially by means of temperature treatment in order to remove, possibly, any volatile components contained in the adhesive, such as, for example solvents or reaction products.

Application of the adhesive during the production of a substrate 1 of the invention can be realised by various ways. Basically, at least one paper ceramic layer 11 and at least one metal and/or metallization layer 2, 3 and the adhesive 6a', 6b', 6a", 6b" necessary to the production of the adhesive connections are for example provided for the production of a substrate 1 according to the invention for electrical circuits. Starting therefrom, an adhesive connection via at least one adhesive layer 6, 6a, 6b between the at least one paper ceramic layer 11 and at least one metal and/or metallization layer 2, 3 are generated in the following steps, by means of a manufacture method which is preferably automated. Generation of the adhesive layer 6, 6a, 6b and/or the adhesive application 6a', 6a", 6b', 6b" necessary to this effect and thereby also filling of the cavities in the form of pores of the paper ceramic layer 11 can be realised via various alternatives of the method.

In a first alternative of the embodiment, for example, the adhesive 6a", 6b" can be applied exclusively onto the respective surface side of the metal layer 2, 3 and subsequently, this can then be adhered with the top and/or the bottom side 11a, 11b of the paper ceramic layer 11. Alternatively, the adhesive 6a', 6b' can exclusively be applied onto the top and/or the bottom side 11a, 11b of the paper ceramic layer 11 and then, the respective metal layer 2, 3 can be adhered therewith. By analogy, the adhesive 6a', 6b', 6a", 6b" can, according to the alternative embodiment as illustrated in FIGS. 2a to 2c, be applied both on the top and/or the bottom side 11a, 11b of the paper ceramic layer 11 and on the metal layer 2, 3.

Corresponding structuring of the paper ceramic layer 11 equipped with the respective adhesive application 6a', 6b', 6a", 6b" with the metal layers 2, 3 then generates the desired adhesive layers 6a, 6b which are composed of adhesive applications 6a', 6b', 6a", 6b" and, apart from production of the mechanical connection between the paper ceramic layer 11 and the respective metal layer 2, 3, moreover ensure filling at least on the surface side of the cavities in the form of pores in the paper ceramic layer 11.

Finally, it is also conceivable to apply said adhesive 6a', 6b' only via the top side 11a or the bottom side 11b of the paper ceramic layer 11 and to transport it onto the respective opposite bottom and/or top side 11b, 11a via the cavities in the form of pores, i.e. to oversaturate the paper ceramic layer 11 by means of a one-sided adhesive application 6a', 6b'. This alternative embodiment requires an almost complete filling of the cavities in the form of pores of the paper ceramic layer 11.

The layers equipped with the respective adhesive application, in particular the paper ceramic layer 11 and/or the metal layers 2, 3 are preferably structured by using a lamination process, i.e. under a defined pressure and/or temperature. Therein, said pressure is calculated such that a homogeneous and bubble-free surface connection of the metal surfaces 2, 3 is ensured on the paper ceramic layer 11. Preferably, bending of the substrate 1 is thereby reduced to a minimum. For example, roll and/or flat laminators can be made use of during the lamination process.

As adhesives in order to generate the adhesive layer 6, 6', various adhesives can be used, which have a temperature stability of at least 100° C. after curing. One can, for example, use chemically and/or physically curable adhesives selected from the group consisting of polyurethane, epoxy resins, polyimides, and methyl methacrylate, which are applied as a one or two-component adhesives and which cure under an increase of temperature and/or an increase of pressure. The adhesive layers 6, 6a, 6b cured accordingly between the metal layers 2, 3 and the paper ceramic layer 11 then preferably have a temperature stability of 100° C. to 350° C. Moreover, and in order to enhance thermal conductivity of the adhesive layer 6, 6a, 6b, fine disperse particles can be admixed to the respective adhesive used which are not electrically conducting but which have a good thermal conductivity, i.e. for example $Si_3N_4$, AlN, or $Al_2O_3$. However, it is preferred to use adhesives and/or adhesive substances having a lower viscosity, i.e. preferably less than 30 Pas, in order to fill the porous top and bottom side 11a, 11b of the paper ceramic layer 5 and thereby improve the isolation strength of the substrate 1. Various adhesives having for example distinct viscosities each, can also be used to produce the adhesive layers 6, 6a, 6b. For example, the adhesives 6a', 6b' provided for filling the cavities in the form of pores and for producing the adhesive connections and which are directly applied to the top and/or bottom side 11a, 11b of the paper ceramic layer 11, should preferably have a low viscosity in order to ensure trouble-free penetration into the cavities in the form of pores. When applying an additional adhesive 6a", 6b" onto the metal layers 2, 3 in order to produce the adhesive layers 6a, 6b, distinct and/or more viscous adhesives having a higher viscosity can then be applied.

The metal layers and/or the metallization layers 2, 3 are for example produced by using thin metal sheets or metal foils. As raw materials can be used for example copper, aluminium, gold, silver, zinc, zinc, molybdenum, tungsten, Cr, or their alloys. The use of composites, i.e. laminates or powder-form metallurgical mixtures of various metals is also possible. Depending on the material used in each case, the metal layers 2, 3 used comprise thickness layers d2 ranging from 10 μm to 5 mm. It is also possible to use so-called resistance alloy materials known in the art and which are distributed under the product names Manganin, Ceranin, or Isaohm, to produce the metal layers 2, 3.

The top and bottom side 11a, 11b of the paper ceramic layer 5 can be adhered with metal layers 2, 3 produced from various metals or with laminate or composite layers, for example a combination of a copper layer and an aluminium layer or a combination of a Manganin layer and an aluminium layer.

The layer thicknesses d2 of the metal layers 2, 3 can be identical or different, and this irrespective of the layer thickness d1 of the ceramic and/or the paper ceramic layer 11 produced by paper technology.

For example, the second metal layer 3 or composite and/or combined layer can form or comprise a cooling body, wherein the metal layer forming the cooling body can, on its surface side opposite to the adhesive layer 6', comprise a profiling to enlarge the surface which can be formed in the most various designs, in particular with respect to the form, arrangement and depth of existing recesses.

The substrates 1 of the invention serve as circuit boards for electrical and electronic circuits or circuit modules, in particular for electronic power circuits. To this effect, at least the first metal layer 2 is structured into several metallization portions which form circuit boards, contact and/or contact surfaces, for example, by means of masking and etching technologies known in the art as such. Preferably, said structuring of the first metal layer 2 is realised following the production of the substrate. Due to the very thin paper ceramic layer 11, preferably only one of the metallization and/or metal layer 2, 3 of the substrate 1 is structured to ensure sufficient stability of the substrate 1. But with a corresponding, stability enhancing intermediate layer, even the structuring of both metallizations and/or metal layers 2, 3 of the substrate 1 is possible.

This type of structuring is part of the subtracting processes where a fraction of the metallization is removed or weakened in a wet chemical process. In contrast to this, additive processes, such as a galvanic separation, can also be used for the aforementioned substrates 1 in order to increase the layer thickness of the metallization on a local basis or over the entire surface. This can for example also be realised by brazing of formed components on defined spots of the structured substrate.

Production of the substrate 1 of the invention in the form of multi-substrates which are separated following manufacture in order to form the desired substrates 1 is also possible. For the substrates 1 according to the invention, said separation is realised for example by means of mechanical processing processes such as for example sawing, cutting or embossing or by using a laser unit or a water jet cutting edge. According to this and by contrast to the state of the art, the unstructured metal layer 7 preferably also extends up to the border of the cutting edge of the respective substrate 1.

In an alternative embodiment of the enhanced substrate 10 of the invention according to FIG. 2, the substrate 10 comprises at least one composite layer 12 having a metal layer 13 and at least one aluminium layer 14 which is connected to the paper ceramic layer 11 by means of an adhesive layer 6.

The aluminium layer 14 of the composite layer 12 can be formed at least partially in an anodized form such that an anodic layer 15 is generated which is connected to the paper ceramic layer 11 via the adhesive layer 16. The anodic layer 15 is provided as an adhesive enhancer in order to replace the normally smooth surface of the aluminium layer 14, which ensures a high adhesive force of the adhesive connection between the paper ceramic layer 11 and the composite layer 12. To this end, the anodic layer 15 has a layer thickness ranging between 1 μm and 15 μm.

By the use of a corresponding process temperature of 120° C. up to 160° C., it is also possible to enlarge existing cracks and/or cavities in the form of pores in the paper ceramic layer 11 and then to simply fill these with the adhesive 6a', 6b'. The temperature increase can then be realised stepwise or on a continuous basis via a defined period of time. During a stepwise temperature increase, any vaporization of any solvents and/or thinners potentially contained in the adhesive is advantageously realised. In order to enhance the conductibility of the adhesives used, these can, in one alternative embodiment of the invention, also be enriched with nano-fibres.

In another alternative embodiment, the respective adhesive layer 6 comprises at least two distinct adhesives, which are preferably applied successively and in layers. For example, one can use adhesives having distinct viscosities, wherein one adhesive having a low viscosity is provided for filling the cavities in the form of pores in the paper ceramic layer 11 and the other adhesive having a high viscosity is provided for producing the adhesive connection of the layer combination.

It is obvious that the process of the invention described also enables the production of substrates 1 having distinct layer structures and in particular the structure of modules, comprising several individual substrates 1.

Apart from the two or three-layer substrates 1 described which are interconnected via corresponding adhesive connections, it is also possible the provide several layers made of alternating metal layers and ceramic layers produced by paper technology means. This enables for example the production of circuit boards arranged within the substrate 1 and which are connected to the outside electrical cover of the substrate 1 having electrical interlayer connections, so-called vias.

It is also possible to use multi-layer composite layers 12 having distinct metal layers and being joined to each other face to face via connection technologies known in the art, such as for example a DCB or AMB connection.

For example, it is also possible to directly adhere, structure or solder, onto a cooling body, a substrate 1 according to the invention comprising a metal layer 2 and a paper ceramic layer 11, i.e. by using a high temperature stable connection layer and/or a corresponding connection technology.

In order to minimise the porosity of the paper ceramic layer 11 prior to the production of the substrate 1 of the invention, other pre-treatments can be realised, i.e. this can be effected while still being in the paper state and/or also on the ceramic already produced.

While still in the paper state, pressing downstream the paper production process, for example by means of calendaring or coating of the paper, can contribute to a reduction of the cavities in the form of pores.

In order to reduce the residual porosity, the paper ceramic layer 11 already sintered can for example still be coated on one or both sides, for example by means of the Sol-Gel-technology, plunging, vaporising or painting. Subsequently to this, however, another sintering of the coated paper ceramic layer is required. It is also possible to fill the cavities in the form of pores at least partially with ceramic materials of the same or another type, i. e for example by means of suspensions of fine ceramic powders or of glass powder having particle sizes significantly ranging under the pore sizes of >5 µm caused by the cellulose fibres.

Alternatively, one could also contemplate materials such as sodium silicate or organic, curable materials.

The terms "approximately", "essentially" or "for example" in the meaning of the invention mean deviations from the respective precise value by +/−10%, preferably by +/−5% and/or deviations in the form of modifications, which are insignificant to the function.

The invention was hereinabove described by means of exemplary embodiments. It is clear that a large number of changes as well as modifications is possible without however diverging from the basic inventive idea of the invention.

LIST OF REFERENCE NUMBERS 1, 10 Substrate
2 First metal layer and/or metallization layer
3 Second metal layer and/or metallization layer
6, 6a, 66 Adhesive layer
6a', 6a", 6b', 6b" Adhesive layer and/or adhesive deposit
11 Paper ceramic layer
12 Composite layer
13 Metal layer
14 Aluminium layer
15 Anodic layer
d1-d3 "Layer thickness"

The invention claimed is:

1. A substrate for electrical circuits, comprising
at least one metal layer and a paper ceramic layer, which is flatly joined to the at least one metal layer and has a top side and a bottom side,
wherein the paper ceramic layer has a plurality of cavities in the form of pores,
characterized in that the at least one metal layer is structured into metallization portions is connected to the paper ceramic layer by means of at least one adhesive layer which is produced by applying at least one adhesive to the metal layer and/or to the paper ceramic layer, wherein the cavities in the form of pores in the paper ceramic layer are filled at least on the surface side by means of the applied adhesive, wherein the paper ceramic layer comprises a porosity of less than 10% after filling with the adhesive;
wherein the metal-ceramic-substrate is a substrate for electrical circuits; and
wherein a penetration depth of the adhesive into the paper ceramic layer comes to at least one third of the layer thickness of the paper ceramic layer adjoining the adhesive layer.

2. The substrate according to claim 1, characterized in that the at least one metal layer is connected to at least one additional metal layer form to a composite layer.

3. The substrate according to claim 2, characterized in that the composite layer comprises a metal layer and at least an aluminium layer or an aluminium alloy layer.

4. The substrate according to claim 3, characterized in that the metal layer is a copper layer or copper alloy layer having a layer thickness between 35 µm and 2 mm and the aluminium layer or the aluminium alloy layer comprises a layer thickness between 10 µm and 300 µm.

5. The substrate according to claim 3, characterized in that the aluminium layer of the composite layer is anodized in order to generate an anodic layer on the surface opposite to the metal layer.

6. The substrate according to claim 1, characterized in that the paper ceramic layer has a layer thickness ranging from 50 µm to 600 µm.

7. The substrate according to claim 1, characterized in that the paper ceramic layer comprises an e-modulus ranging from 90 GPa to 150 GPa.

8. The substrate according to claim 1, characterized in that the paper ceramic layer is produced with a paper structure enriched with ceramic, sinterable filler material by means of thermal implementation, wherein the percentage of the ceramic, sinterable filler materials of the enriched paper structure exceeds 80 wt. %.

9. The substrate according to claim 8, characterized in that $Al_2O_3$, $Si_3N_4$, AlN, $ZrO_2$, MgO, SiC, BeO, or a combination of these, or an associated typical sinter means, are provided as ceramic filler material of the paper structure.

10. The substrate according to claim 1, characterized in that the paper ceramic layer comprises a top and a bottom side and the top side is flatly joined to a first metal layer by means of an adhesive layer and the bottom side is flatly joined to a second metal layer by means of another adhesive layer.

11. The substrate according to claim 1, characterized in that the adhesive used to produce the adhesive layer has a viscosity of less than 30 Pas.

12. The substrate according to claim 1, characterized in that the layer thickness of the paper ceramic layer ranges from 1 to 30 µm.

13. The substrate according to claim 1, characterized in that the adhesive layer is made of a chemically and/or physically curable adhesive of the group comprising polyurethane, epoxy resins, polyimides or methyl methacrylate and/or that the adhesive layer is produced of at least two distinct adhesives, possibly, having a distinct viscosity.

14. The substrate according to claim 1, characterized in that the cavities in the form of pores are filled with adhesive.

15. The substrate according to claim 1, characterized in that the at least one metal layer is made of copper, aluminium, gold, silver, tin, zinc, molybdenum, tungsten, Cr or their alloys.

16. A method for producing a substrate for electrical circuits, comprising
flatly joining at least one metal layer to a top side or a bottom side of at least one paper ceramic layer wherein the paper ceramic layer comprises a plurality of cavities in the form of pores, and
structuring the at least one metal layer into metallization portions;
characterized in that adhesive is flatly applied on the surface of the at least one metal layer and/or the top and/or bottom layer of the paper ceramic layer, especially such that cavities of the paper ceramic layer in the form of pores are filled by means of the applied adhesive at least on the surface side, wherein the plurality of cavities in the form of pores of the paper ceramic layer are filled with adhesive such, that after, the paper ceramic layer has a porosity of less than 10%; and wherein a penetration depth of the adhesive into the paper ceramic layer comes to at least one third of the layer thickness of the paper ceramic layer adjoining the adhesive layer.

17. The method according to claim 16, characterized that the adhesive is applied exclusively onto the surface side of the at least one metal layer and subsequently adhered with the top or bottom side of the paper ceramic layer.

18. The method according to claim 16, characterized in that the adhesive is flatly applied exclusively to the surface of the top and/or bottom side of the paper ceramic layer and subsequently adhered with the at least one metal layer.

19. The method according to claim 16, characterized in that the adhesive is flatly applied both onto the surface side of the at least one metal layer and onto the top and/or bottom side of the paper ceramic layer and that subsequently both are adhered together.

20. The method according to claim 19, characterized in that at least two different adhesive types are applied onto the at least one metal layer and onto the top and/or bottom layer of the paper ceramic layer, wherein the viscosity of the adhesive applied to the paper ceramic layer.

21. The method according to claim 16, characterized in that adhesive is flatly applied exclusively on via the top or bottom side of the paper ceramic layer, wherein the amount of adhesive is calculated such that the cavities in the form of pores are filled.

22. The method according to claim 16, characterized in that the amount of adhesive used is determined such that, when being in the connected state, an adhesive layer is generated having a layer thickness ranging from 1 to 30 µm.

23. The method according to claim 16, characterized in that the cavities in the form of pores are filled by means of the adhesive applied at least alongside one third of the layer thickness of the paper ceramic layer.

* * * * *